SIGNAL RESPONSIVE APPARATUS

Filed Feb. 28, 1963 3 Sheets-Sheet 1

INVENTORS
JOHN F. BRUDER
SYLVAN BERNFELD
MAURITZ L. GRANBERG
BY [signature]
ATTORNEY United States Patent Office 3,218,478 Patented Nov. 16, 1965

3,218,478

SIGNAL RESPONSIVE APPARATUS

Sylvan Bernfeld, Shoreview, John F. Bruder, St. Paul, and Mauritz L. Granberg, Minneapolis, Minn., assignors to Sperry Rand Corporation, New York, N.Y., a corporation of Delaware Filed Feb. 28, 1963, Ser. No. 261,752
5 Claims. (Cl. 307—88.5)

This invention relates in general to electronic signal responsive apparatus and in particular to solid-state logic circuits.

With the advent of the mass-production of the digital computers, it has become increasing desirable to utilize large numbers of similar circuits packaged in individual plug-in modules or "card-types." One aspect of this invention involves one such module designated "gated sense amplifier" whose function is to provide the gated constant gain amplification of a memory system output. Provisions are included for ORing a plurality of memory system sense amplifiers at the gated sense amplifier input with no substantial effect upon amplifier performance. Another aspect of this invention involves novel particular portions of the gated sense amplifier each portion capable of performing a plurality of functions in a pulse-type solid-state electronic data processing system.

Accordingly, it is a primary object of this invention to provide a solid-state logic module.

Another object of this invention is to provide a solid-state gated constant-gain amplifier.

Another object of this invention is to provide a solid-state amplifier capable of ORing a plurality of sense amplifiers at its input without causing a substantial effect upon its performance.

Another object of this invention is to provide a cross-coupled base, cross-coupled emitter transistor pair detector.

Another object of this invention is to provide a cross-coupled base, cross-coupled emitter transistor pair differential amplifier.

Another object of this invention is to provide a memory system solid-state sense amplifier.

A further object of this invention is to provide a solid-state constant gain amplifier which gates out inhibit signal noise.

A still further object of this invention is to provide a solid-state constant gain amplifier providing rectification of the input signal.

These and other more detailed and specific objectives will be disclosed in the course of the following specification, reference being had to the accompanying drawings, in which:

FIG. 1 illustrates an exemplary embodiment of this invention wherein there is disclosed a circuit schematic of a solid-state gated constant-gain amplifier.

FIG. 2*a* discloses the circuit schematic of the cross-coupled base, cross-coupled emitter transistor pair detector of FIG. 1.

FIG. 2*b* is a block diagram of the circuit of FIG. 2*a*.

FIG. 3*a* discloses the circuit schematic of the sense amplifier of FIG. 1.

FIG. 3*b* is a block diagram of the circuit of FIG. 3*a*.

Figure 1:
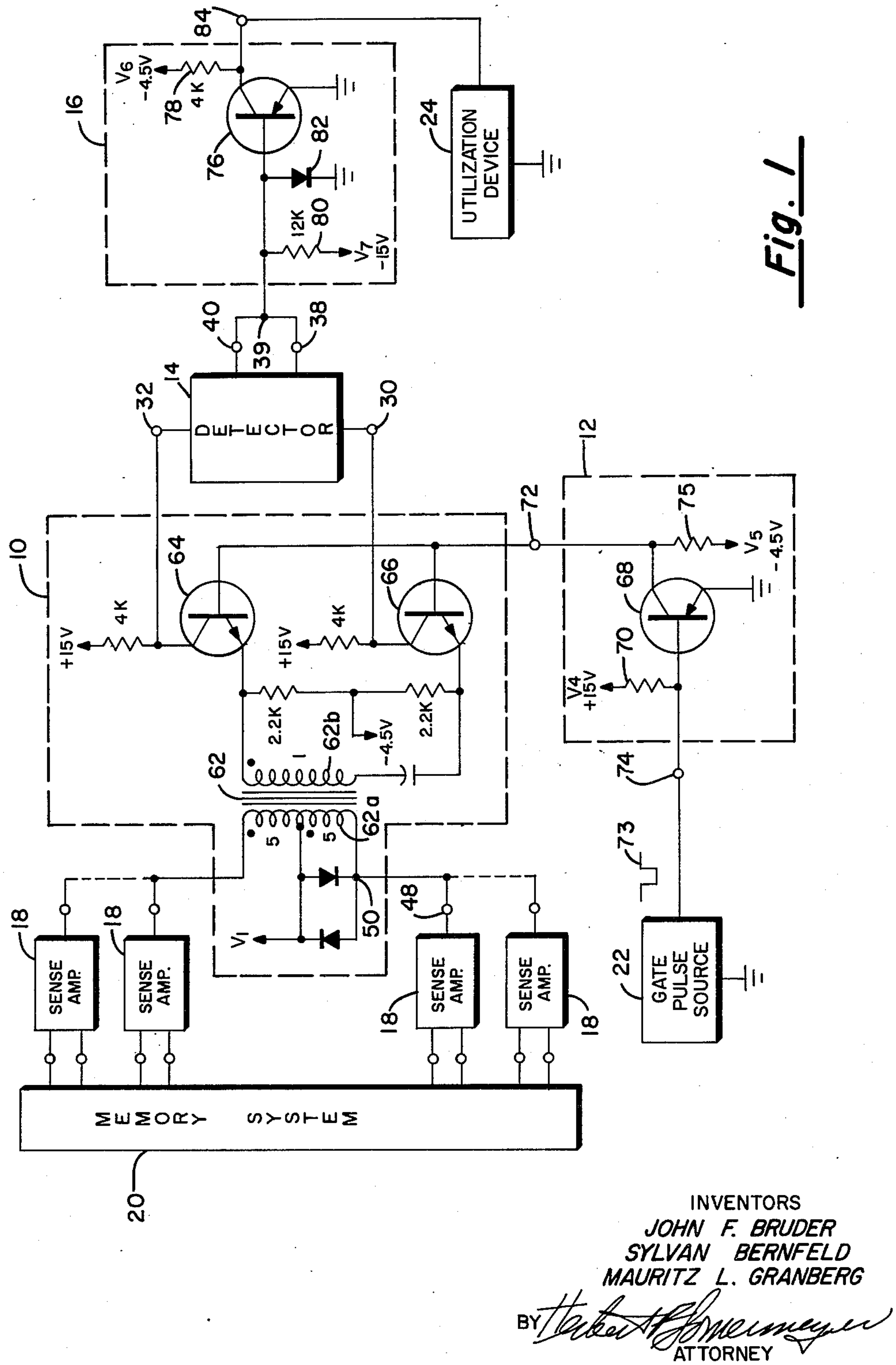

As stated above, the invention disclosed herein and illustrated particularly in FIG. 1 provides a solid-state module for the gated constant-gain amplification of a memory system output signal. The embodiment of FIG 1 may be thought of as being comprised of four essential parts: input means 10, gating means 12, detector means 14, and output means 16. A plurality of sense amplifiers 18 couple the output signals of memory system 20 to input means 10 which, when properly gated by gating means 12 by means of gate pulse source 22, provides an output signal from output means 16 to utilization device 24.

Figure 2A:
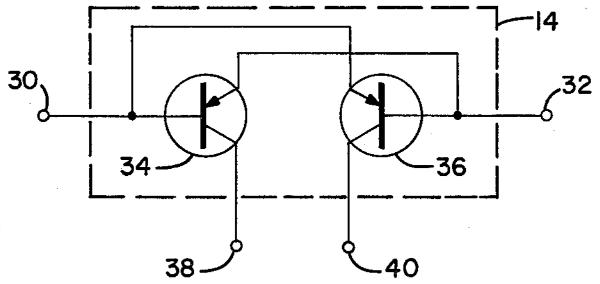
Figure 2B:
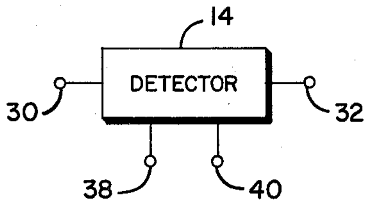

With particular reference to FIG. 2*a* and its block diagram of FIG. 2*b*, there is disclosed a circuit schematic of detector 14. The basic function of detector 14 is to detect a voltage differential between terminals 30 and 32—of sufficient amplitude to forward bias the base-emitter junction of either transistor 34 or 36 causing transistor 34 or 36 to operate in a conducting mode—providing a collector current which will flow to the more positive base terminal, i.e., from terminal 40 to terminal 30 or from terminal 38 to terminal 32.

As an example of the above, assume that the voltage level of terminal 30 is more positive than that of terminal 32 and of a sufficient degree to cause transistor 36 to operate in a conducting mode. Then, terminal 40 is a source of current which will return to terminal 30 through suitable circuitry. Conversely, if the voltage level of terminal 32 is more positive than that of terminal 30 and of a sufficient degree to cause transistor 34 to operate in a conducting mode, terminal 38 is a source of current which will return to terminal 32 through suitable circuitry.

It is apparent to one of ordinary skill in the art to which the present invention pertains that by a reversal of the PNP type transistors of the illustrated embodiment of detector 14 to a NPN type transistor the opposite signal relationships will apply. As an example, using NPN type transistors in detector 14, assume that the voltage level of terminal 30 is more positive than that of terminal 32 and of a sufficient degree to cause transistor 34 to operate in a conducting mode. Then terminal 38 is a source of current which will return to terminal 32 through suitable circuitry. Conversely, if the voltage level of terminal 32 is more positive than that of terminal 30 and of a sufficient degree to cause transistor 36 to operate in a conducting mode, terminal 40 is a source of current which will return to terminal 30 through suitable circuitry.

If terminals 38 and 40 are intercoupled at a common terminal 39 as in FIG. 1, then terminal 39 will provide the same signals as terminals 38 and 40 did separately as in FIG. 2*a*. For example, any time that there is a voltage level difference between terminals 30 and 32 of sufficient amplitude to forward bias the base-emitter junction of transistor 34 or 36 a current will flow from terminal 39 to the more positive terminal of either terminal 30 and 32.

Figure 3A:
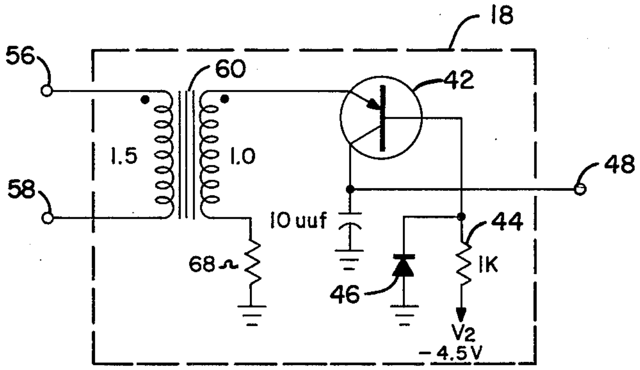
Figure 3B:
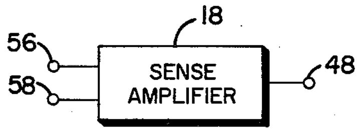
Figure 4:
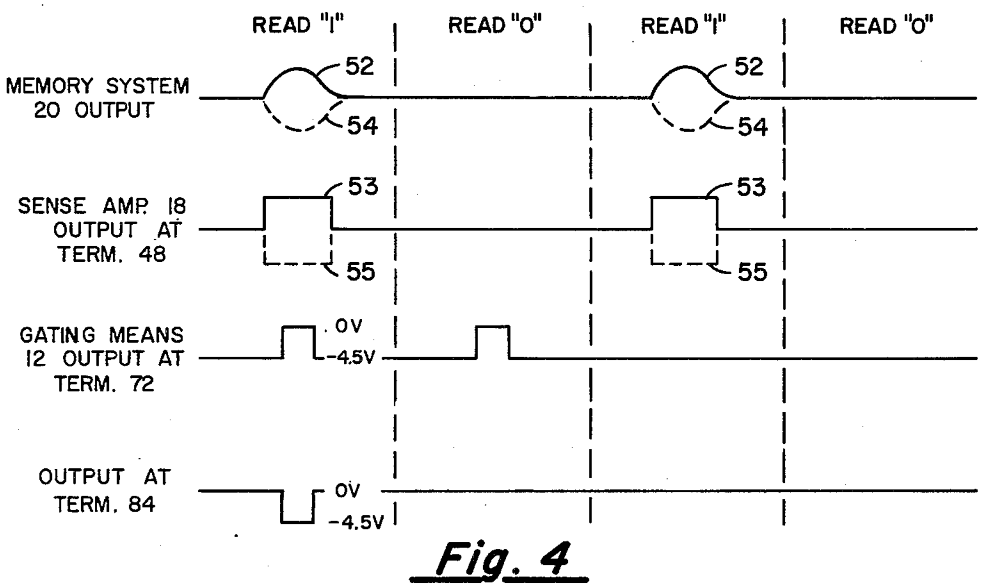
FIG. 4 illustrates the signal wave forms associated with the circuit of FIG. 1.

With particular reference to FIG. 3, there is disclosed the circuit schematic of sense amplifier 18. Transistor 42 is biased into the class A conducting mode through the voltage networks of $V_2$, resistor 44 and diode 46. With diode 46 clamping the base electrode of transistor 42 at approximately −0.8 volt and with $V_2$ equal to −4.5 volts, a collector current of approximately 6 milliamps (ma.) flows into input means 10 when terminal 48 of sense amplifier 18 is coupled to terminal 50 of input means 10. When a memory system 20 output signal 52 or 54 indicative of a logical "1" (see FIG. 4 is impressed across terminals 56 and 58 and through transformer 60, a current variation of approximately 0.3 ma. occurs in the emitter-collector circuit of transistor 42. As transistor 42 is in the common-base configuration, winding **62*a* of transformer 62 is affected by a current variation of approximately 0.3 ma. This current variation is stepped up through transformer 62 into winding 62*b*** to approximately 1.5 ma.

With particular reference to FIG. 4 there is disclosed the pertinent signal wave forms of FIG. 1. The memory system 20 utilized with the gated sense amplifier of FIG. 1 produces a positive output signal 52 and a negative output siganl 54 of substantial amplitude upon the readout of a logical "1" and an output signal of insubstantial amplitude upon the readout of a logical "0." Signals 52 and 54 when coupled across terminals 56 and 58 of sense amplifier 18 produce signals 53 and 55, respectively, at terminal 48 of sense amplifier 18. When positive signal 53 is coupled to terminal 50 of input means 10 there is induced in winding **62*b* a signal providing a positive voltage level at the emitter electrode of transistor 64. This forward biases the base-emitter junction of transistor 64 causing transistor 64 to operate in the conducting mode when gated by gating means 12. Alternatively, if the gating function of gating means 12 is not required the common-coupled base electrodes of transistors 64 and 66 may be coupled to ground potential. When negative signal 55 is coupled to terminal 50 of input means 10 there is induced in winding 62*b* a signal providing a positive voltage level at the emitter electrode of transistor 66. This forward biases the base-emitter junction of transistor 66 causing transistor 66 to operate in the conducting mode when gated by gating means 12**.

Transistors 64 and 66 comprise a differential amplifier which, when gated by gating means 12, couple a signal generated by signals 53 or 55 (see FIG. 4) to detector 14, to output means 16 and thence to utilization device 24. Transistor 68 of gating means 12 is normally biased into the nonconducting mode due to the $V_4$ voltage of +15 volts coupled to its base-electrode through resistor 70. With transistor 68 in the nonconducting mode terminal 72 is held at approximately −4.5 volts through resistor 75 to the $V_5$ voltage of −4.5 volts. With terminal 72 coupled to the common coupled bases of transistors 64 and 66, transistors 64 and 66 have the same voltage (−4.5 volts) at their base electrodes as at their emitter electrodes thus transistors 64 and 66 are held in a nonconducting mode, preventing the passage of a signal therethrough. When gate pulse source 22 couples gate pulse 73 to terminal 74 of gating means 12 and thence to the base electrode of transistor 68 its base-emitter junction is forward-biased causing transistor 68 to operate in a conducting mode. Terminal 72 then assumes a voltage level of approximately ground potential which voltage level is in turn coupled to the common-coupled base electrodes of transistors 64 and 66 causing the operating mode of transistors 64 and 66 to be a function of the voltage in winding **62*b***.

As discussed previously with respect to FIG. 2*a*, when detector 14 terminals 38 and 40 are intercoupled at terminal 39 any voltage difference between terminals 30 and 32 produces an output signal at terminal 39 which is coupled to the base electrode of transistor 76 of output means 16. Transistor 76 is normally biased into the conducting mode due to the $V_6$ voltage of −4.5 volts coupled to its collector electrode through resistor 78 and the $V_7$ voltage of −15 volts coupled to its base electrode at terminal 39 through resistor 80 with diode 82 clamping the base electrode to a maximum voltage level of approximately 0.5 volt. Thus, the normal ungated output signal at terminal 84 is a constant voltage level of approximately ground potential. However, if a voltage difference exists between terminals 30 and 32, a positive output signal is coupled to terminal 39 which causes the base electrode of transistor 76 to assume the diode 82 clamping voltage of +0.5 volt. This voltage reverse biases the base-emitter junction of transistor 76 causing transistor 76 to operate in a nonconducting mode producing an output signal at terminal 84 of approximately −4.5 volts.

Figure 5:
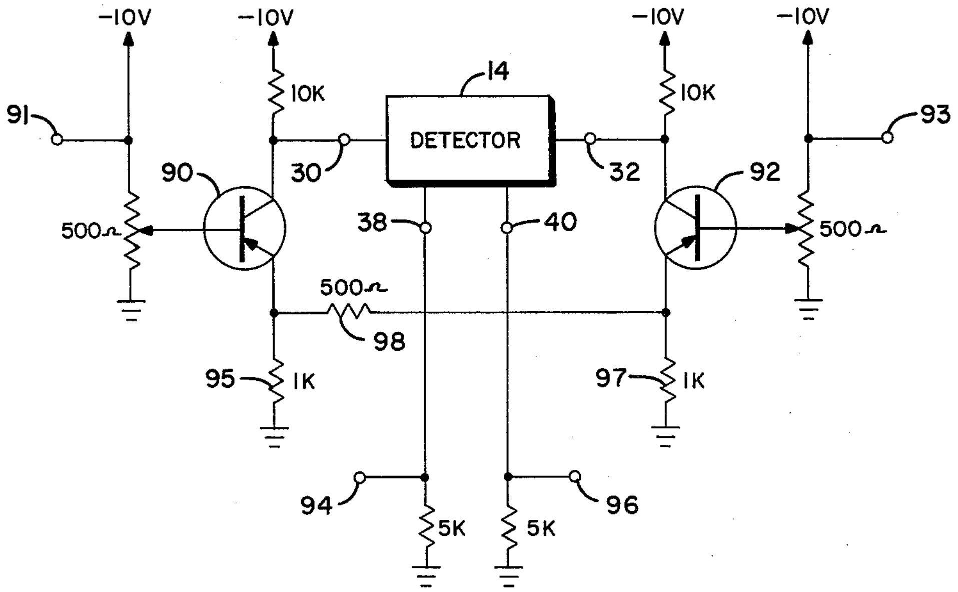
FIG. 5 illustrates a further application of the circuit of FIG. 2*a*.

As stated hereinbefore, one object of the present invention is to provide a novel solid-state circuit having a plurality of uses in a data processing system. Referring to FIG. 5, there is shown a circuit schematic incorporating a NPN type transistor detector 14 of FIG. 2*a*. This circuit has an application where a circuit more sensitive to input voltage differences than that of FIG. 2*a* is desired. In FIG. 5 termnials 30 and 32 of detector 14 are driven by high impedance signal sources—collector electrodes of transistors 90 and 92—as in FIG. 1. The use of transistors 90 and 92 in the input circuits of detector 14 permits the detection of a much smaller voltage difference input across terminals 91 and 93. This arrangement greatly reduces the nonresponsive span of detector 14 to the voltage differences applied across terminals 91 and 93. If a higher gain at terminals 94 and 96 is desired, the common-coupled emitters of transistors 90 and 92 may be coupled by a resistor 98 whose magnitude would determine the desired gain. When resistor 98 is omitted the emitter electrodes of transistors 90 and 92 are common-coupled and a common resistor of one-half the sum of the magnitudes of resistors 95 and 97 is used to couple the common-coupled emitter electrodes to ground. Omission of resistor 98 at this point provides the circuit which is most sensitive to the differences of the voltage levels at terminals 91 and 93.

Figure 6:
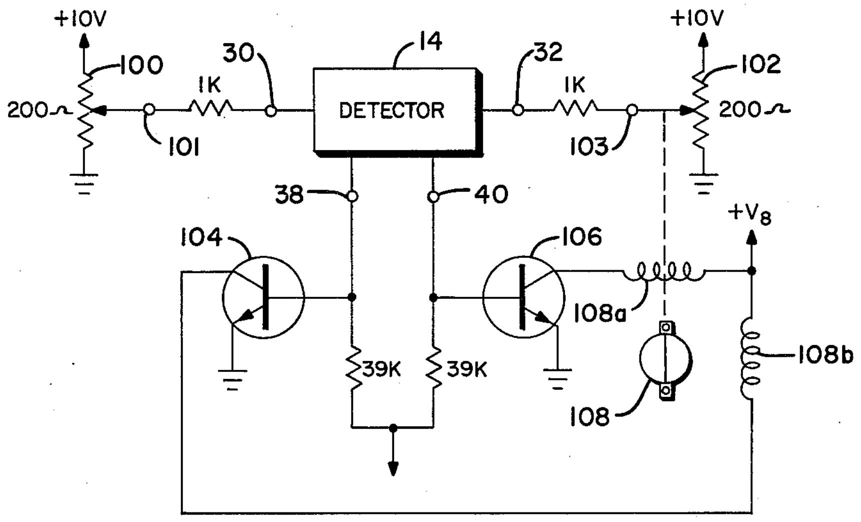
FIG. 6 illustrates a still further application of the circuit of FIG. 2*a*.

Referring to FIG. 6, there is shown a circuit schematic incorporating detector 14 of FIG. 2*a* into a servo drive system. In this arrangement, any pick-off voltage difference between potentiometers 100 and 102 provides the necessary input voltage difference across terminals 30 and 32 producing a signal at either terminal 38 or 40, depending upon the difference polarity. For example, assume that potentiometer 100 has a pick-off voltage of 5.0 volts and potentiometer 102 has a pick-off voltage of 4.0 volts, terminal 101 is one volt positive with respect to terminal 103. As discussed with regard to FIG. 2, this causes transistor 36 to operate in a conducting mode producing a positive signal of approximately 0.5 volt at terminal 40. With terminal 40 coupling the positive 0.5 volt on the base of transistor 106, transistor 106 operates in the conducting mode causing a current flow through winding **108*a* of split-field direct-current motor 108. This, in turn, rotates the rotor of motor 108 moving the pick-off arm of potentiometer 102 toward an increasing pick-off voltage until potentiometer 100 and 102** pick-off voltages are identical—within the sensitivity of the circuit.

It is therefore apparent that the illustrated embodiments of applicants' invention have accomplished the stated objectives.

It is understood that suitable modifications may be made in the structure as disclosed provided such modifications come within the spirit and scope of the appended claims. Having now, therefore, fully illustrated and described our invention, what we claim to be new and desire to protect by Letters Patent, is:

1. Signal responsive apparatus comprising:
gating means,
output means including a transistor having base, emitter and collector electrodes,
input means including a transformer means having an input winding and an output winding and first and second similar type transistors each having base, emitter and collector electrodes,
a plurality of amplyfying means each coupling a separate and mutually exclusive output pulse to said input means transformer means input winding,
the base electrode of said first transistor directly coupled to the base electrode of said second transistor and directly coupled to said gating means,
the emitter electrodes of said first and second transistors coupled across said input means transformer means output winding, and
a differential amplifier having first and second input terminals and an output terminal wherein said input terminals are coupled directly across the collector electrodes of said input means first and second transistors and said output terminal is coupled directly to the base electrode of said output means transistor.

2. A signal responsive apparatus comprising:
gating means, output means including a transistor having base, emitter and collector electrodes, input means including a transformer means having an input winding and an output winding and first and second similar type transistors each having base, emitter and collector electrodes, a plurality of amplifying means each coupling a separate and mutually exclusive output pulse to said input means transformer means input winding, the base electrode of said input means first transistor directly coupled to the base electrode of said input means second transistor and directly coupled to said gating means, the emitter electrodes of said input means first and second transistors coupled across said input means transformer means output winding, a differential amplifier having first and second input terminals and an output terminal wherein said input terminals are coupled directly across the collector electrodes of said input means first and second transistors and said output terminal is coupled directly to the base electrode of said output means transistor, an output means output terminal coupled directly to the output means transistor collector electrode, said gating means normally maintaining said input means first and second transistors in the nonconducting mode, a gate pulse source coupling a gate pulse to said gating means causing the input means first and second transistors to operate in the conducting mode as a function of the amplifying means output pulse coupled to said input means, the arrangement being such that an output signal is presented at said output means output terminal only upon the concurrent coupling of said gate pulse to said gating means and said amplifying means output pulse to said input means.

3. A signal responsive apparatus comprising:

gating means, output means including a transistor having base, emitter and collector electrodes, input means including a transformer means having an input winding and an output winding and first and second similar type transistors each having base, emitter and collector electrodes, a plurality of amplifying means each coupling a separate and mutually exclusive output pulse to said input means transformer means input winding, the base electrode of said input means first transistor directly coupled to the base electrode of said input means second transistor and directly coupled to said gating means, the emitter electrodes of said input means first and second transistors coupled across said input means transformer means output winding, detector means including first and second similar type transistors each having base, emitter and collector electrodes, the detector means first transistor base electrode coupled directly to the detector means second transistor emitter electrode, the detector means second transistor base electrode coupled directly to the detector means first transistor emitter electrode, the detector means first transistor collector electrode coupled directly to the detector means second transistor collector electrode, the base electrodes of said detector means first and second transistors coupled directly across the collector electrodes of said input means first and second transistors, the intercoupled collector electrodes of said detector means first and second transistors coupled directly to the base electrode of said output means transistor, an output means output terminal coupled directly to the output means transistor collector electrode, said gating means normally maintaining said input means first and second transistors in the nonconducting mode, a gate pulse source coupling a gate pulse to said gating means causing the input means first and second transistors to operate in the conducting mode as a function of the amplifying means output pulse coupled to said input means, the arrangement being such that an output signal is presented at said output means output terminal only upon the concurrent coupling of said gate pulse to said gating means and said amplifying means output pulse to said input means.

4. Signal responsive apparatus comprising:

gating means, output means including a transistor having base, emitter and collector electrodes, input means including a transformer means having an input winding and an output winding and first and second similar type transistors each having base, emitter and collector electrodes, a plurality of amplifying means each coupling a separate and mutually exclusive unipolar output pulse to at least a first end of said input means transformer means input winding, the base electrode of said input means first transistor directly coupled to the base electrode of said input means second transistor and directly coupled to said gating means, the emitter electrodes of said input means first and second transistors coupled across said input means transformer means output winding, detector means including first and second similar type transistors each having base, emitter and collector electrodes wherein said first transistor base, emitter and collector electrodes are coupled directly to said second transistor emitter, base and collector electrodes, respectively, the detector means first and second transistor base electrodes coupled directly across the collector electrodes of said input means first and second transistors and having its intercoupled collector electrodes coupled directly to the base electrode of said output means transistor, an output means output terminal coupled directly to the output means transistor collector electrode.

5. Signal responsive apparatus comprising:

gating means, output means including an output terminal, input means including a transformer means having an input winding and an output winding and first and second similar type transistors each having base, emitter and collector electrodes, a plurality of amplifying means each coupling a separate and mutually exclusive output pulse to at least a first end of said input means transformer means input winding, the base electrode of said input means first transistor directly coupled to the base electrode of said input means second transistor and directly coupled to said gating means, the emitter electrodes of said input means first and second transistors coupled across said input means transformer means output winding, detector means having first and second similar type transistors having base, emitter and collector electrodes with said base-emitter electrodes directly cross-coupled and said collector electrodes directly intercoupled and said detector means first and second transistor base electrodes coupled across said input means first and second transistor collector electrodes, said detector means intercoupled first and second transistor collector electrodes coupled to said output means, a gate pulse source coupling a gate pulse to said gating means, the arrangement being such that an output signal is presented at said output means output terminal only upon the concurrent coupling of said gate pulse to said gating means and said amplifying means output pulse to said input means.

References Cited by the Examiner

UNITED STATES PATENTS

| | | | |
|---|---|---|---|
| 2,903,602 | 9/1959 | Fleisher | 307—88.5 |
| 2,941,046 | 6/1960 | Pokrant | 330—22 |

FOREIGN PATENTS

| | | |
|---|---|---|
| 890,836 | 3/1962 | British. |
| 1,232,185 | 10/1960 | French. |

OTHER REFERENCES

Transistors in Radio and Televisions, by Kiver 12–56, McGraw-Hill, New York, pages 34 and 35.

Principles of Transistor Circuits, by Shea et al., January 1956, John Wiley & Sons, Inc., New York, pp. 433 and 434.

DAVID J. GALVIN, *Primary Examiner.*

ARTHUR GAUSS, *Examiner.*